US006650174B2

(12) United States Patent
Bell

(10) Patent No.: US 6,650,174 B2
(45) Date of Patent: *Nov. 18, 2003

(54) ACTIVE PULLUP CIRCUITRY FOR OPEN-DRAIN SIGNALS

(75) Inventor: David Bundy Bell, Los Altos, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/028,243

(22) Filed: Dec. 18, 2001

(65) Prior Publication Data

US 2002/0053905 A1 May 9, 2002

Related U.S. Application Data

(63) Continuation of application No. 09/116,309, filed on Jul. 15, 1998.

(51) Int. Cl.[7] .............................. G05F 1/10; G05F 3/02
(52) U.S. Cl. ........................ 327/540; 327/112; 327/379
(58) Field of Search ................................. 327/108, 111, 327/112, 379, 546; 326/26, 27

(56) References Cited

U.S. PATENT DOCUMENTS

| | | | | |
|---|---|---|---|---|
| 4,779,013 A | | 10/1988 | Tanaka | 326/27 |
| 5,404,051 A | * | 4/1995 | Kobayashi | 327/108 |
| 5,598,119 A | | 1/1997 | Thayer et al. | 327/111 |
| 5,812,021 A | | 9/1998 | Ikeda | 327/541 |
| 5,835,999 A | | 11/1998 | Grosspietsch et al. | 327/328 |
| 5,877,634 A | | 3/1999 | Hunley | 326/83 |
| 5,877,647 A | | 3/1999 | Vajapey et al. | 327/391 |

FOREIGN PATENT DOCUMENTS

DE   37 38 800 A1   5/1989

OTHER PUBLICATIONS

Benchmarq Microelectronics Inc. et al., "System Management Bus Specification," *Smart Battery System Specifications*, Revision 1.0, Feb. 15, 1995, pp. 1–17.

Philips Semiconductors, "The I²C–Bus and How To Use It (including specifications)," Apr. 1995, pp. 1–24.

* cited by examiner

*Primary Examiner*—Terry D. Cunningham
*Assistant Examiner*—Quan Tra
(74) *Attorney, Agent, or Firm*—Fish & Neave; Joel Weiss; Jeffrey C. Aldridge

(57) ABSTRACT

Circuitry and methods are provided for reducing rise time associated with signals on an open-drain or open-collector signal line. Signal line voltage is monitored to determine if the signal line is being pulled LOW. If the signal line is not being pulled LOW, as indicated by signal line voltage exceeding a threshold level, additional pullup current is provided. The additional current may be provided gradually in relation to the signal line voltage, or may be provided in full whenever voltage exceeds the threshold. Circuitry may also be provided to monitor voltage slew rate on the signal line, and to enable the additional pullup current only when the slew rate exceeds a positive threshold level.

11 Claims, 4 Drawing Sheets

ACTIVE PULLUP CIRCUITRY FOR OPEN-DRAIN SIGNALS

This application is a continuation of U.S. patent application Ser. No. 09/116,309, filed on Jul. 15, 1998, and is hereby incorporated by reference herein in its entirety.

BACKGROUND OF THE INVENTION

The present invention relates to methods and circuitry for increasing communication speeds in systems employing open-drain or open-collector circuitry for driving a signal line, and more particularly methods and circuitry for providing slew rate sensitive, hysteretic, active pullup.

"Open-drain" terminology is used extensively throughout the description which follows. Although "open-drain" may imply the use of field effect transistors, such as MOSFETs, one of skill in the art will recognize that other types of transistors, such as bipolar transistors may be used as well. Thus, it is to be understood that the open-drain terminology is used herein as a matter of convenience, and that the terminology specifically includes open-collector type circuits. Furthermore, it is to be understood that the invention may be practiced using other than MOSFET transistors and that "transistor" specifically includes such other suitable types of transistors.

Open-drain circuitry is commonly used to interconnect electronic devices by way of a common bus or signal line. The Inter-Integrated Circuit bus ($I^2C$), the System Management Bus (SMBus), ACCESS.bus, and Apple Desktop Bus (ADB) are a few of the inter-device communication protocols that use an open-drain architecture. Open-drain signals are also used within computer systems for lines that may be driven by more than one source, e.g., an interrupt input of a microprocessor.

A device sends signals on an open-drain signal line by controlling a transistor coupled between the open-drain signal line and ground. Typically the transistor, which is used as a switch, is an N-channel MOSFET, but other types of transistors are also suitable for this purpose. In addition, the transistor may be internal to the device, or the device may have a terminal for controlling an external transistor.

When the device causes the transistor to be ON, the signal line is coupled to ground, causing its voltage to be pulled down to a LOW state or level, e.g., less than about 0.4 volts. Conversely, when all devices cause their corresponding driver transistors to be OFF, the signal line is biased to a HIGH state, e.g., 5 volts, by pullup circuitry connected between the signal line and a power supply rail.

The speed at which signals may be transmitted on an open-drain signal line is dependent on how rapidly the signal line can be cycled between LOW and HIGH levels. Because of parasitic capacitance associated with the signal line, the rate at which it may be switched is determined by how rapidly the parasitic capacitance may be charged and discharged. Other factors being equal, an increase in parasitic capacitance slows the charge and discharge rates, and lowers the maximum signaling rate. Therefore, many open-drain based interconnection standards specify a maximum signal line capacitance, typically a few hundred picofarads, to ensure adequate performance.

Another factor determining the rate at which the parasitic capacitance is charged and discharged is the resistance in the charge and discharge current paths. Since the resistance of an output transistor is typically very small when the transistor is ON, the parasitic capacitance may be discharged very rapidly, and the transition from HIGH to LOW occurs quickly. However, the parasitic capacitance is charged by pullup current provided by some form of pullup circuitry.

In a typical application employing an open-drain signal line, the pullup circuitry is simply a pullup resistor coupled between the signal line and a positive supply rail. Because the resistance of a pullup resistor is typically much larger than the ON resistance of a driver transistor, the rate at which the parasitic capacitance may be charged is much slower than the rate at which it may be discharged. The signal rise time is, therefore, much slower than the signal fall time.

One technique for shortening signal rise time is to use a smaller valued pullup resistor. Using a smaller resistance increases the available pullup current, so that any parasitic capacitance may be charged more quickly when all driver transistors are OFF. However, reducing pullup resistance may have adverse effects on circuit operation.

For example, reducing the value of the pullup resistor increases current flow from $V_{cc}$ to ground when a driver transistor is ON. This increased current represents wasted electrical power, which may be an important consideration in low power applications such as battery powered devices. The increased current also increases the voltage drop across the driver transistor, thereby raising the signal line voltage and reducing the noise margin associated with a LOW signal line level.

In view of the foregoing it would, therefore, be desirable to improve data signaling speeds in communication systems employing an open-drain architecture, by reducing the rise time associated with open-drain signals, without compromising noise margin or power efficiency.

SUMMARY OF THE INVENTION

It is therefore an object of the present invention to improve data signaling speeds in communication systems employing an open-drain architecture, by reducing the rise time associated with open-drain signals, without compromising noise margin or power efficiency.

These and other objects and advantages of the present invention are realized by methods and circuitry in which pullup current is provided by a variable current source in which the available pullup current is a function of a voltage level on the signal line. In particular, the available pullup current is increased when the signal line voltage indicates that the signal line is not being pulled LOW.

In a first embodiment, the additional pullup current is provided whenever a signal on the signal line exceeds a threshold level. In a preferred embodiment, circuitry is provided to monitor the slew rate (dV/dt) of the signal, and higher pullup current is provided only when the signal exceeds the threshold and the slew rate is positive, such as during a LOW-to-HIGH signal transition.

BRIEF DESCRIPTION OF THE DRAWINGS

The above and other objects of the present invention will be apparent upon consideration of the following detailed description taken in conjunction with the accompanying drawings, in which like reference characters refer to like parts throughout, and in which.

DETAILED DESCRIPTION OF THE INVENTION

Figure 1A:
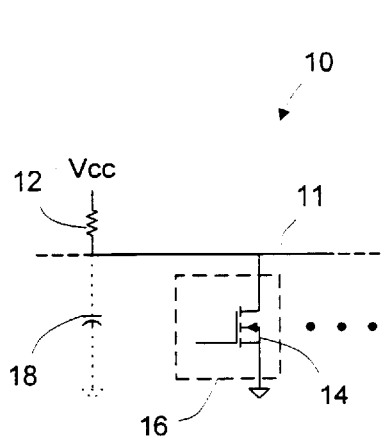
FIGS. 1A through 1C are simplified schematic diagrams depicting three previously known types of pullup circuitry.
Figure 1B:
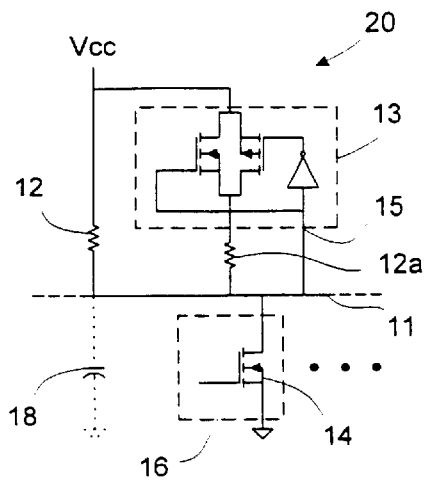
Figure 1C:
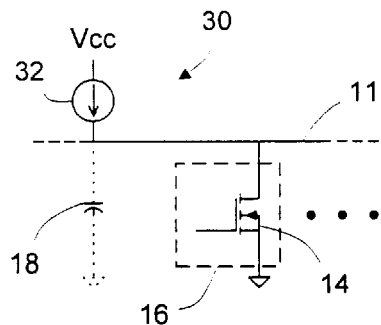

FIGS. 1A through 1C are simplified schematic diagrams of previously known circuitry for implementing signal lines using an open-drain architecture. Device 16 represents a device coupled to signal line 11 and may be anything from an integrated circuit to a computer peripheral. Device 16 includes driver transistor 14 which may be turned ON or OFF by additional circuitry within device 16 (not shown). Alternatively, device 16 may include a terminal for controlling an external driver transistor. It should be noted that in the schematics of FIGS. 1, 3, and 5 only one device is shown connected to signal line 11; however, one skilled in the art will understand that there may be more than one such device.

Capacitor 18 represents the parasitic capacitance associated with signal line 11, including stray capacitance associated with signal line 11 itself, as well as with the drivers and receivers coupled to signal line 11. The main effect of parasitic capacitance 18, which is typically on the order of a few hundred picofarads, is to limit the rate at which data may be sent on signal line 11. Specifically, the data rate on signal line 11 is limited by the rate at which the parasitic capacitance may be charged and discharged. For this reason, most communication protocols employing an open-drain architecture specify a maximum signal line capacitance. For example, the I²C specification allows a maximum signal line capacitance of 400 pF.

Driver transistor 14 is connected between signal line 11 and ground so that device 16 may actively pull signal line 11 LOW by turning driver transistor 14 ON. Since any similar device connected to signal line 11 is capable of pulling it LOW, the signal line can only be HIGH when driver transistor 14 associated with each device is turned OFF.

Thus, any device connected to signal line 11 may selectively drive the signal line LOW by turning ON the driver transistor associated with the device. Conversely, when transistor 14 is OFF in all devices connected to signal line 11, pullup circuitry connected to the signal line biases the signal line HIGH.

In FIG. 1A, pullup circuitry 10 consists of pullup resistor 12 connected between $V_{cc}$ and signal line 11. When transistor 14 is switched OFF, current flows through pullup resistor 12 to signal line 11, pulling it up to $V_{cc}$. Typically, pullup resistor 12 has a value on the order of a few thousand ohms.

Figure 2A:
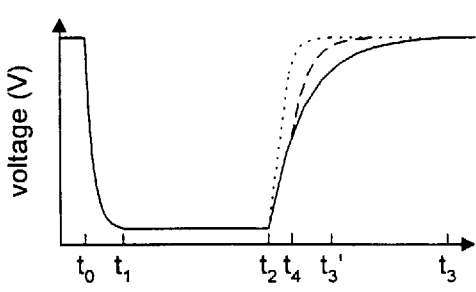
FIGS. 2A and 2B are, respectively, a graph of signal line voltage as a function of time, and pullup current as a function of signal line voltage, for the pullup circuits of FIGS. 1A–C.

A typical signal on signal line 11 of FIG. 1A is shown by the solid trace in FIG. 2A. Prior to time $t_0$, transistor 14 is OFF, and signal line 11 is HIGH. At time $t_0$, transistor 14 is turned ON by device 16, providing a low resistance path between signal line 11 and ground. This rapidly discharges capacitance 18 to ground, pulling signal line 11 LOW at time $t_1$. The interval between time $t_0$ and $t_1$, i.e., the time needed for signal line 11 to reach a LOW level after transistor 14 is turned ON, is referred to as the fall time ($t_f$).

At time $t_2$, transistor 14 is turned OFF by device 16. Current through pullup resistor 12 charges capacitance 18 causing the voltage on signal line 11 to rise, pulling signal line 11 HIGH at time $t_3$. The interval between time $t_2$ and $t_3$, i.e., the time needed for signal line 11 to reach a HIGH level after transistor 14 is turned OFF, is referred to as the rise time ($t_r$).

In essence, the circuit of FIG. 1A is a resistor-capacitor (RC) circuit. The response of RC circuits exhibit a characteristic exponential waveform over a time determined by the time constant of the circuit, wherein the time constant is the product of circuit capacitance and the resistance in the current path. Circuits having a larger time constant have longer rise and fall times.

In a typical open-drain system, the value of pullup resistor 12 is much larger than the ON-resistance of driver transistor 14. This causes signal rise time ($t_r$) to be many times longer than the signal fall time ($t_f$). Since the rate at which data may be transmitted on signal line 11 is largely limited by the rise time ($t_r$), techniques for increasing data transmission rates have generally focused on shortening the rise time in open-drain systems.

As described in the background of the invention, rise time may be reduced by reducing the value of pullup resistor 12. This would reduce the RC time constant of the circuit, thereby providing a shorter rise time. Since reducing pullup resistance may adversely affect power consumption and noise susceptibility, other techniques have been developed to reduce signal rise time.

One such previously known technique for reducing rise time is illustrated in the schematic diagram of FIG. 1B. Open-drain circuitry 20 includes pullup resistor 12, transistor 14, and capacitance 18 which correspond to like elements of FIG. 1A. Pullup circuitry 20 also includes additional pullup resistor 12a, which may be selectively connected in parallel with pullup resistor 12 by means of switch 13. Switch 13, which may be, for example, a CD4066 CMOS switch, is controlled by a level on control input 15, such that a LOW signal at control input 15 causes switch 13 to be OFF, while a HIGH signal causes the switch to be ON.

In the circuitry of FIG. 1B, when transistor 14 is ON, signal line 11 is LOW and switch 13 is OFF. When transistor 14 is initially turned OFF, and assuming no other device is pulling signal line 11 LOW, pullup resistor 12 provides current to charge parasitic capacitance 18, and signal line voltage begins to rise. When signal line voltage rises enough to turn switch 13 ON, typically about one-half $V_{cc}$, resistor 12a is connected in parallel with pullup resistor 12, effectively reducing the total pullup resistance and increasing the available pullup current.

The decrease in pullup resistance caused by turning on switch 13 is a function of the relative values of resistors 12 and 12a. For example, if the values of resistors 12 and 12a are equal, the available pullup resistance is effectively halved when switch 13 is turned ON. This reduces the RC time constant associated with pulling signal line 11 high, resulting in a shorter rise time ($t_r$).

Figure 2B:
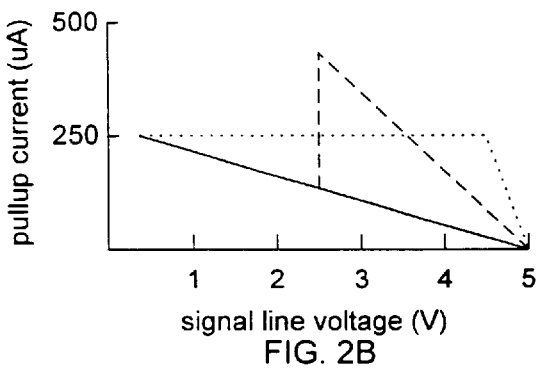

The response of pullup circuitry 20 is shown in FIGS. 2A and 2B. From time $t_0$ to $t_1$, the circuit response and waveform are nearly identical to those of FIG. 1A. At time $t_2$ transistor 14 is turned OFF, and the voltage on signal line 11 begins to rise, following the same waveform as the solid trace corresponding to the circuit of FIG. 1A. At time $t_4$ signal line 11 reaches a voltage of about one-half $V_{cc}$ and switch 13 turns ON, greatly reducing pullup resistance. The reduced pullup resistance reduces the RC time constant and signal line voltage rises much faster, as shown by the dashed line in FIG. 2A. The corresponding pullup current is shown by the dashed line in FIG. 2B.

Clearly, in the circuit of FIG. 1B, all signal line driver transistors must be OFF before the signal line voltage can rise enough to turn ON switch 13. As a result, pullup resistor 12 may be made large enough to address the concerns about excess current, power consumption, and noise margin discussed hereinabove, and resistor 12a may be made small enough to provide adequate pullup performance.

A third alternative pullup scheme is shown in FIG. 1C, wherein pullup current for signal line 11 is provided by constant current source 32. In the circuitry of FIGS. 1A, and 1B, pullup current drops as the voltage on signal line 11 rises, giving the response waveform its characteristic exponential shape. Using a constant current source ensures that the pullup current, and hence the charging rate of capacitance 18, remains nearly constant, resulting in a near linear increase in signal line voltage. This is illustrated by the dotted line in FIGS. 2A and 2B. Note, that as signal line voltages near the supply rail, pullup current begins to drop due to reduced operating headroom for constant current source 32.

Although the circuitry of FIGS. 1B and 1C are effective at reducing signal rise times in open-drain circuits, maximum signaling rates are still limited to less than about 1 MHz using these types of pullup circuits. In addition, care must be taken to keep stray capacitance to a very small value, for example, by limiting the length of signal line 11, or the number of devices connected to signal line 11.

Figure 3:
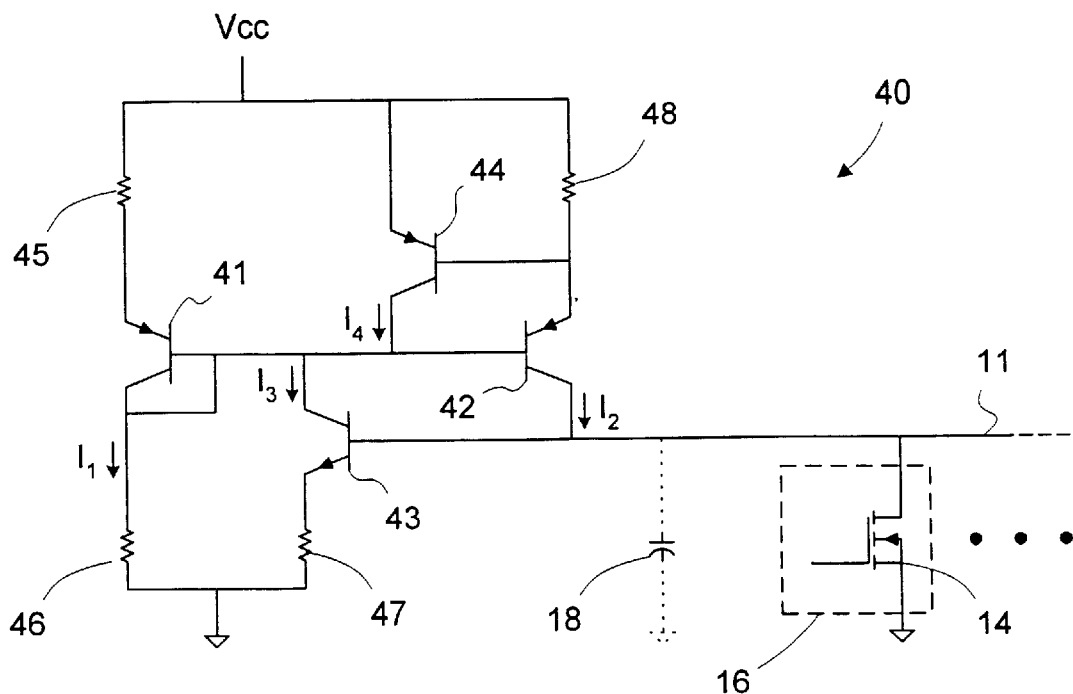
FIG. 3 is a simplified schematic diagram of a first illustrative embodiment of pullup circuitry in accordance with principles of the present invention.

Referring now to FIG. 3, a first illustrative embodiment of pullup circuitry in accordance with principles of the present invention is described. Pullup circuitry 40 includes transistors 41–44, and resistors 45–48. Transistors 41 and 42 are connected to form a current mirror such that collector current $I_2$ of transistor 42 is approximately proportional to collector current $I_1$ of transistor 41. If signal line 11 is LOW, transistor 43 is biased OFF, and the current $I_1$ is determined by the values of resistors 45 and 46.

When all open-drain driver transistors connected to signal line 11, e.g., transistor 14, are OFF, the collector current of transistor 42 begins to charge parasitic capacitance 18, and the voltage on signal line 11 increases. When the signal line voltage exceeds the base-emitter voltage drop of transistor 43, it begins conducting, sending current $I_3$ through resistor 47. The sum of currents $I_1$ and $I_3$ flows through current mirror transistor 41, consequently increasing current $I_2$, and making additional current available to charge parasitic capacitance 18. As the voltage on signal line 11 continues to rise, current $I_3$ also continues to increase, resulting in a continued increase in current $I_2$. Thus, the pullup current is a direct function of the signal line voltage.

Eventually, current $I_2$ is large enough that the voltage drop across resistor 48 begins to forward bias the base-emitter junction of transistor 44 causing it to begin conducting current $I_4$. Current $I_4$ tends to offset any further increase in current $I_3$ caused by the rising signal line voltage, thereby providing an upper limit on current $I_2$. Finally, as the voltage on signal line 11 begins to approach $V_{cc}$, pullup current $I_2$ begins to drop off due to saturation of transistor 42 and reduction of the voltage across resistor 48.

The reverse sequence of events occurs when signal line 11 is pulled LOW by turning ON an open-drain driver connected to signal line 11, e.g., transistor 14. First, dropping signal line voltage increases current mirror headroom, and pullup current increases up to the limit set by transistor 44. Pullup current is still much less than the current through driver transistor 14, so signal line voltage continues to drop. Eventually, signal line 11 voltage is low enough that transistor 43 turns OFF, eliminating current $I_3$, and consequently reducing available pullup current $I_2$ to the level set by resistors 45 and 46. An exemplary graph of pullup current versus signal line voltage for the circuitry of FIG. 3 is shown in FIG. 4.

Figure 4:
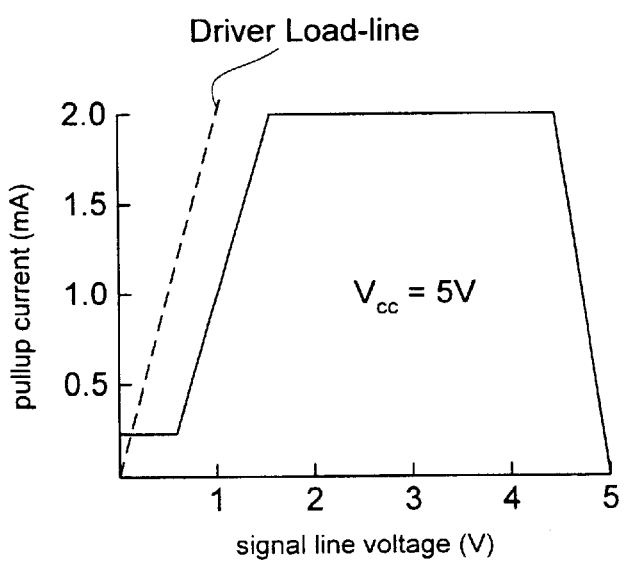
FIG. 4 is a representative graph of pullup current as a function of signal line voltage for the pullup circuitry of FIG. 3.

FIG. 4 also shows a dashed line which represents a load-line corresponding to the ON resistance of driver transistor 14. This is an indication of how much current transistor 14 can sink at any given signal line voltage, i.e., the available "pull-down" current. In designing a pullup circuit such as that in FIG. 3, it is important that the pullup current always remain less than the current transistor 14 can sink. Otherwise, transistor 14 cannot sink enough current to pull signal line 11 LOW.

Figure 5:
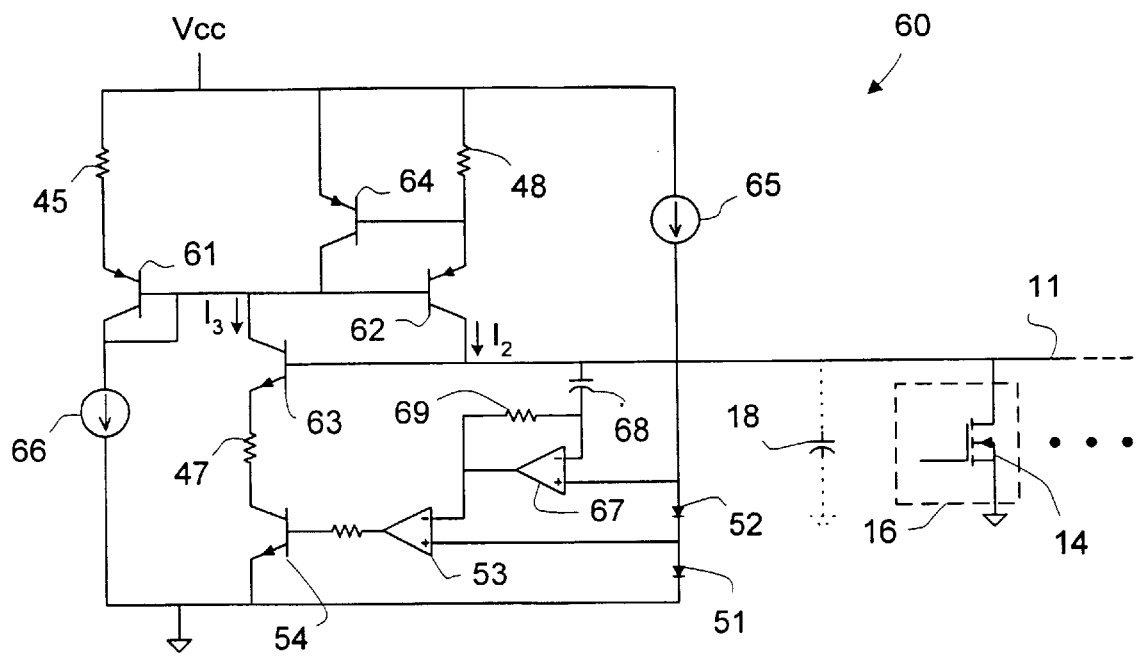
FIG. 5 is a simplified schematic diagram of a second illustrative embodiment of pullup circuitry in accordance with principles of the present invention.

An illustrative schematic diagram of a more preferred embodiment of pullup circuitry is shown in FIG. 5. In accordance with the principles of the present invention, pullup circuitry 60 provides additional pullup current only when signal line 11 is not being pulled LOW.

Pullup circuitry 60 functions in a manner analogous to the circuitry of FIG. 3. Transistors 61 and 62 form a current mirror, wherein the current through transistor 62 provides pullup current to signal line 11. Transistor 63 causes an increase in pullup current $I_2$ as signal line voltage increases, and transistor 64 limits the maximum pullup current to an acceptable level. However, pullup circuitry 60 includes additional circuitry to create hysteresis in the current-voltage characteristic of the pullup circuit as is shown in FIG. 6.

Operational amplifier 67, in conjunction with capacitor 68 and resistor 69 form a differentiator that monitors the change in voltage on signal line 11. The output of operational amplifier 67 is a signal indicative of how fast the signal line voltage is changing, i.e., the slew rate. When the signal corresponds to a positive slew rate that exceeds a threshold level, comparator 53 outputs a signal turning ON transistor 54. The threshold level is provided at the '+' input of comparator 53 by current source 65 and diodes 51 and 52. Turning transistor 54 ON enables current $I_3$ to flow through transistor 63, providing increased pullup current in a manner analogous to that described in connection with FIG. 3.

However, when the voltage slew rate is below the threshold because the signal line voltage is constant or falling, comparator 53 keeps transistor 54 turned OFF, and pullup current $I_2$ is limited to a value set by current source 66. Transistor 54 and the associated slew rate circuitry introduce hysteresis into the current-voltage characteristic of pullup circuitry 60. That is, the pullup current provided by pullup circuitry 60 depends on whether the signal voltage is rising or falling. A representative current-voltage characteristic is shown in FIG. 6.

Figure 6:
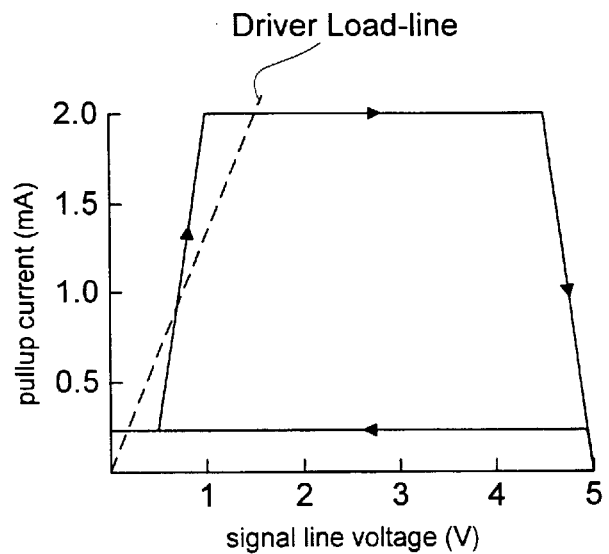
FIG. 6 is a representative graph of pullup current as a function of signal line voltage for the pullup circuitry of FIG. 5.

Because pullup circuitry 60 provides additional pullup current only when the voltage on signal line 11 is rising, the pullup current may exceed the pull-down current load line represented by a dashed line in FIG. 6. This enables the rise in pullup current to be very rapid. Indeed, as long as the increased current is only provided when signal line 11 is not being pulled down, the change in pullup current may be an instantaneous step change.

Figure 7:
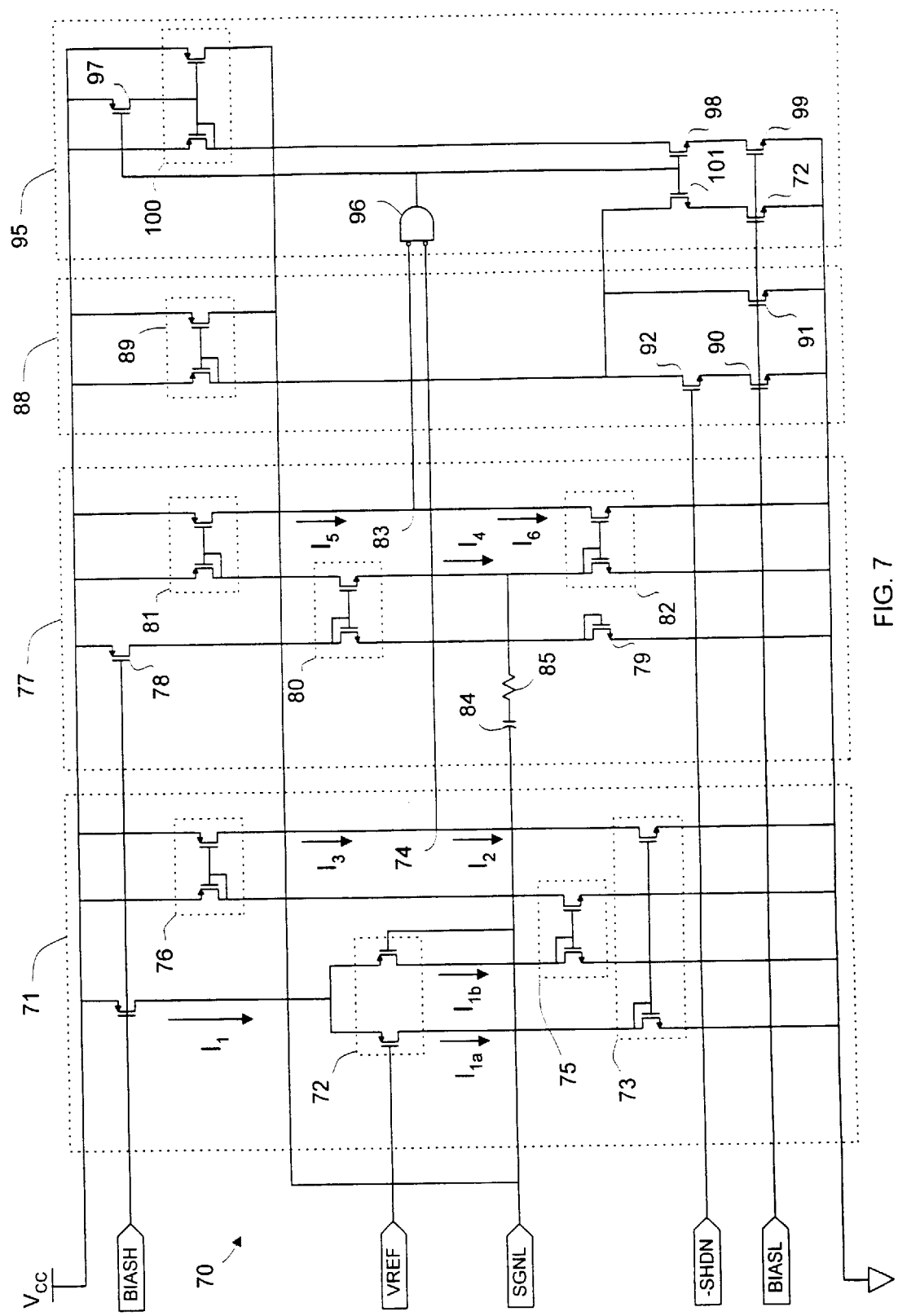
FIG. 7 is a simplified schematic diagram of a third illustrative embodiment of active pullup circuitry employing principles of the present invention.

Referring now to FIG. 7, exemplary pullup circuitry for providing a hysteretic, non-linear pullup current is described in more detail. Pullup circuitry 70 includes four basic sections of circuitry: voltage level detection circuitry 71 for monitoring the voltage level on signal line 11; slew rate detection circuitry 77 for monitoring the rate at which the signal line voltage is changing; nominal pullup current circuitry 88 for providing pullup current when the signal line is stable or being pulled down; and high pullup current circuitry 95 for providing increased pullup current when needed. In addition, pullup circuitry 70 includes circuitry for implementing a low power mode suitable for use in battery powered systems.

Additional voltages and signals are provided to the circuitry of FIG. 7 by circuitry not shown therein. For example, voltage regulating circuitry (not shown) provides voltages to BIASH and BIASL for biasing, respectively, the high-side and low-side MOSFET current sources of FIG. 7, and provides a voltage reference to VREF. Additional circuitry provides a shutdown signal to −SHDN. SGNL is connected to the signal line, e.g., signal line 11 of FIG. 5.

Taking each section of FIG. 7 in turn, voltage level detection circuitry 71 includes a differential amplifier 72 which splits current $I_1$ into currents $I_{1a}$ and $I_{1b}$ according to the voltage at SGNL relative to the voltage at VREF (a voltage reference). Current $I_{1a}$ is mirrored by current mirror 73 to provide current $I_2$ tending to pull node 74 to ground. Similarly, current $I_{1b}$ is mirrored by current mirrors 75 and 76 to provide current $I_3$ tending to pull node 74 up to $V_{cc}$.

If the voltage at SGNL is lower than VREF, which is preferably about 0.6 volts, current $I_{1a}$ is smaller than current $I_{1b}$, and consequently, current $I_2$ is smaller than $I_3$. This results in node 74 being pulled up to a high level. Conversely, if the voltage at SGNL is higher than VREF, current $I_{1a}$ is larger than current $I_{1b}$ and current $I_2$ is greater than $I_3$, resulting in node 74 being pulled low. Thus, node 74 is LOW when SGNL voltage exceeds VREF, and HIGH otherwise.

Turning now to slew rate detection circuitry 77, constant current $I_4$ is provided by transistors 78, 79, and 80 in conjunction with current mirror 82. Current $I_4$ is mirrored by current mirrors 81 and 82 to provide currents $I_5$ and $I_6$, respectively. Preferably, current mirror 81 has a gain of about twice that of current mirror 82, so that current $I_5$ is normally about twice as large as $I_6$, and node 83 is pulled high.

Capacitor 84 blocks any DC component of SGNL voltage, but passes the AC component through to current mirror 82. Specifically, an increasing SGNL voltage adds to the current flowing into current mirror 82, thereby increasing current $I_6$. At the same time, the current flowing through current mirror 81 is reduced, thereby decreasing current $I_5$. A sufficiently rapid positive change in SGNL voltage causes current $I_6$ to be larger than $I_5$, pulling node 83 low. Capacitor 84 and resistor 85 are selected to provide adequate sensitivity to slew rate without being overly sensitive to noise on the signal line (SGNL). Suitable values for capacitor 84 and resistor 85 are about 2 pF and about 187 Ω, respectively.

Nominal pullup current circuitry 88 provides pullup current when the SGNL line is stable or being pulled down. Circuitry 88 includes current mirror 89 having an output current coupled back to SGNL, and an input current set by transistors 90 and 91. Transistor 92 may be turned OFF by a low level on the −SHDN terminal, isolating transistor 90, and thereby reducing the input current to current mirror 89.

This circuit architecture provides a means of reducing pullup current to a shutdown level when appropriate. For example, when the signal line is high, and has been high for an extended period of time, pullup current may be reduced to a low level to conserve power in a battery powered device. Preferably, pullup circuitry 88 is designed such that normal pullup current is about 250 μA when −SHDN is HIGH, and low power pullup current is about 100 μA when −SHDN is LOW.

Lastly, pullup current boost circuitry 95 provides additional pullup current when the voltage at SGNL is above a threshold voltage, as determined by voltage level detection circuitry 71, and exceeds a minimum positive slew rate, as determined by slew rate detection circuitry 77. The inputs to gate 96 are coupled to node 74, the output of voltage level detector 71, and node 83, the output of slew rate detector 77. As described hereinabove, node 74 is pulled LOW whenever the voltage level at SGNL exceeds VREF, and node 83 is pulled LOW whenever the voltage slew rate at SGNL becomes sufficiently large. The output of gate 96 is HIGH only when both inputs are LOW. Thus, the output of gate 96 is high when the conditions for supplying boosted pullup current are satisfied.

A HIGH output of gate 96 turns transistor 97 OFF and transistor 98 ON, thereby enabling a constant current source comprising transistor 99 and current mirror 100. The output of current mirror 100 is connected in parallel with the output of current mirror 89, so as to provide boosted pullup current. Preferably, the output current of current mirror 100 is about 1.7 mA.

In addition, a HIGH at the output of gate 96 turns ON transistor 101. Transistor 101 provides an additional source of input current for current mirror 89, increasing its output current. Preferably, turning ON transistor 101 increases the output of current mirror 89 to about 300 μA. Thus, when the voltage level and slew rate conditions are satisfied, i.e., during LOW-to-HIGH transitions, pullup current is boosted from about 250 μA to about 2 mA, thereby significantly reducing signal rise time.

One skilled in the art will appreciated that the present invention may be practiced by other than the described embodiments, which are presented for purposes of illustration and not of limitation, and that the present invention is limited only by the claims which follow.

What is claimed is:

1. Pullup circuitry for an open-drain signal line, the pullup circuitry comprising:

circuitry for monitoring a slew rate of a signal on the open-drain signal line;

circuitry for providing a pullup current to the open-drain signal line responsive to the monitored slew rate exceeding a slew rate threshold; and circuitry for increasing the pullup current responsive to a voltage level of the signal.

2. Pullup circuitry for an open-drain signal line, the pullup circuitry comprising:

circuitry for monitoring a slew rate of a signal on the open-drain signal line;

circuitry for providing a pullup current to the open-drain signal line responsive to the monitored slew rate exceeding a slew rate threshold, wherein the circuitry for providing the pullup current comprises first circuitry for providing a first current independent of the monitored slew rate, and second circuitry for providing a second current responsive to the monitored slew rate; and circuitry for increasing the pullup current responsive to a voltage level of the signal.

3. The pullup circuitry of claim 2 wherein the pullup current is increased responsive to the voltage level exceeding a voltage threshold, and wherein the increase in pullup current is a function of the voltage level relative to the voltage threshold.

4. Pullup circuitry for an open-drain signal line, the pullup circuitry comprising:

circuitry including an operational amplifier for monitoring a slew rate of a signal on the open-drain signal line;

circuitry for providing a pullup current to the open-drain signal line responsive to the monitored slew rate; and circuitry for increasing the pullup current responsive to a voltage level of the signal.

5. Pullup circuitry for an open-drain signal line, the pullup circuitry comprising:

circuitry including an operational amplifier for monitoring a slew rate of a signal on the open-drain signal line;

circuitry for providing a pullup current to the open drain signal line responsive to the monitored slew rate, wherein the circuitry for providing the pullup current comprises first circuitry for providing a first current independent of the monitored slew rate, and second circuitry for providing a second current responsive to the monitored slew rate; and circuitry for increasing the pullup current responsive to a voltage level of the signal.

6. The pullup circuitry of claim 5 wherein the pullup current is increased responsive to the voltage level exceeding a voltage threshold, and wherein the increase in pullup current is a function of the voltage level relative to the voltage threshold.

7. The pullup circuitry of claim 6 wherein the pullup current is increased responsive to the monitored slew rate exceeding a slew rate threshold.

8. The pullup circuitry of claim 4 wherein the circuitry for monitoring the slew rate is a differentiator.

9. A method for biasing an open-drain signal line, the method comprising:

monitoring a slew rate of a signal on the signal line;

providing a pullup current to the signal line responsive to the monitored slew rate exceeding a slew rate threshold; and increasing the pullup current responsive to a voltage level of the signal.

10. A method for biasing an open-drain signal line, the method comprising:

monitoring a slew rate of a signal on the signal line;

providing a pullup current to the signal line responsive to the monitored slew rate exceeding a slew rate threshold, wherein providing the pullup current comprises providing a first current independent of the monitored slew rate, and providing a second current responsive to the monitored slew rate; and increasing the pullup current responsive to a voltage level of the signal.

11. The method of claim 10 wherein the second current is provided responsive to the monitored slew rate exceeding a slew rate threshold.

* * * * *